United States Patent
Takeda et al.

(10) Patent No.: US 7,826,297 B2
(45) Date of Patent: Nov. 2, 2010

(54) POWER SUPPLY SWITCHING CIRCUIT

(75) Inventors: Takahisa Takeda, Chiba (JP);
Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 165 days.

(21) Appl. No.: 12/328,180

(22) Filed: Dec. 4, 2008

(65) Prior Publication Data
US 2009/0146499 A1 Jun. 11, 2009

(30) Foreign Application Priority Data
Dec. 6, 2007 (JP) .............................. 2007-315461

(51) Int. Cl.
*G11C 7/00* (2006.01)
(52) U.S. Cl. .................. 365/226; 365/185.24
(58) Field of Classification Search .................. 365/226, 365/185.24
See application file for complete search history.

(56) References Cited
U.S. PATENT DOCUMENTS 6,205,054 B1 * 3/2001 Inami .................... 365/185.05
6,215,352 B1 * 4/2001 Sudo ........................... 327/530
6,229,734 B1 * 5/2001 Watanabe ............... 365/185.22
6,335,878 B1 * 1/2002 Yamada et al. ......... 365/185.03

FOREIGN PATENT DOCUMENTS

JP    6-290593 A    10/1994

* cited by examiner

*Primary Examiner*—Michael T Tran
(74) *Attorney, Agent, or Firm*—Brinks Hofer Gilson & Lione

(57) ABSTRACT

In a power supply switching circuit, a transistor that switches to a highest voltage is formed of an enhancement type PMOS transistor, and transistors that switch other voltages are each formed of a depletion type NMOS transistor. A signal for controlling a gate of each of the transistors is input through a level shifter. The depletion type NMOS transistor does not operate in a bipolar manner even if a source voltage thereof reaches a power supply voltage VPP1 or VPP2, and the enhancement type PMOS transistor does not operate in the bipolar manner even if a gate voltage and a source voltage thereof reach the power supply voltage VPP1, and a drain voltage thereof reaches the power supply voltage VPP2. Accordingly, there can be provided the power supply voltage switching circuit that is high in efficiency.

4 Claims, 2 Drawing Sheets

US 7,826,297 B2

POWER SUPPLY SWITCHING CIRCUIT

RELATED APPLICATIONS

This application claims priority under 35 U.S.C. §119 to Japanese Patent Application No. JP2007-315461 filed on Dec. 6, 2007, the entire content of which is hereby incorporated by reference.

BACKGROUND OF THE INVENTION

Prior Art

The present invention relates to a power supply switching circuit that switches over a power supply voltage that is output when data is read and written with respect to a memory cell of a nonvolatile memory such as an electronically erasable and programmable read only memory (EEPROM).

A conventional power supply switching circuit is described. FIG. 2 is a circuit diagram illustrating a conventional power supply switching circuit.

The conventional power supply switching circuit includes an enhancement type PMOS transistor 21, an enhancement type PMOS transistor 23, a depletion type NMOS transistor 22, and a depletion type NMOS transistor 24.

In the conventional power supply switching circuit, a ground voltage VSS is applied to a gate of the enhancement type PMOS transistor 23 to turn on the enhancement type PMOS transistor 23. A voltage that is equal to or higher than a power supply voltage V2 is applied to a gate of the depletion type NMOS transistor 24 to turn on the depletion type NMOS transistor 24. Accordingly, the power supply voltage V2 is output as a power supply voltage VOUT. In this case, the ground voltage VSS is applied to a gate of the depletion type NMOS transistor 22 to turn off the depletion type NMOS transistor 22 (for example, refer to Patent document 1).

[Patent document 1] JP 06-290593 A (FIG. 1)

In the conventional power supply switching circuit having a structure described above, there is a fear that a leak current flows from a drain of the depletion type NMOS transistor 22 to a source thereof when a power supply voltage V1 is higher than the power supply voltage V2. The leak current allows a current to flow in a well (back gate) of the enhancement type PMOS transistor 21, resulting in a fear that the enhancement type PMOS transistor 21 operates in a bipolar manner with the well thereof as a base, a substrate thereof as an emitter, and a source thereof as a collector.

SUMMARY OF THE INVENTION

In order to solve the above-mentioned problem, the present invention provides a power supply switching circuit that switches over a power supply voltage that is output when data is read and written with respect to a memory cell of a nonvolatile memory, the power supply switching circuit including: an enhancement type PMOS transistor having a gate input with a voltage based on a first input voltage, a source input with a first power supply voltage being a highest voltage among a plurality of power supply voltages, a drain disposed on an output terminal side, and a back gate input with the first power supply voltage; and a depletion type NMOS transistor having a gate input with a voltage based on a second input voltage, a source disposed on the output terminal side, a drain input with a second power supply voltage being a voltage lower than the first power supply voltage, and a back gate input with a ground voltage.

In the power supply switching circuit according to the present invention, the depletion type NMOS transistor does not operate in a bipolar manner even when the source voltage thereof reaches the first power supply voltage. The enhancement type PMOS transistor does not operate in the bipolar manner even when the gate voltage and the source voltage thereof reach the first power supply voltage, and the drain voltage thereof reaches the second power supply voltage because the gate voltage and the source voltage thereof are higher than the drain voltage thereof. Accordingly, there can be provided the power supply switching circuit that is high in efficiency.

DETAILED DESCRIPTION OF THE EMBODIMENT

Hereinafter, a description is given of a power supply switching circuit according to an embodiment of the present invention with reference to the drawings.

Figure 1:
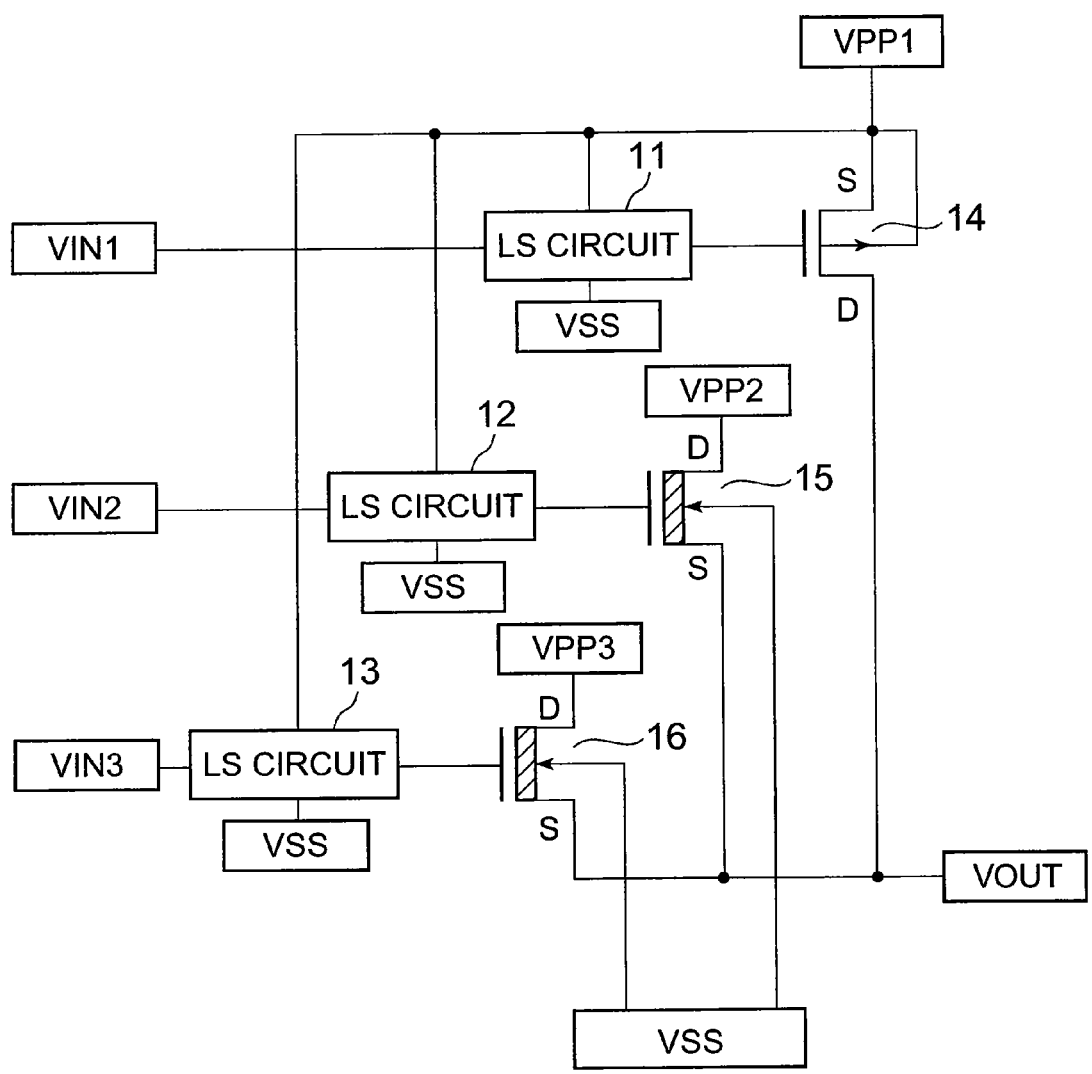
FIG. 1 is a circuit diagram illustrating a power supply switching circuit according to the present invention.
Figure 2:
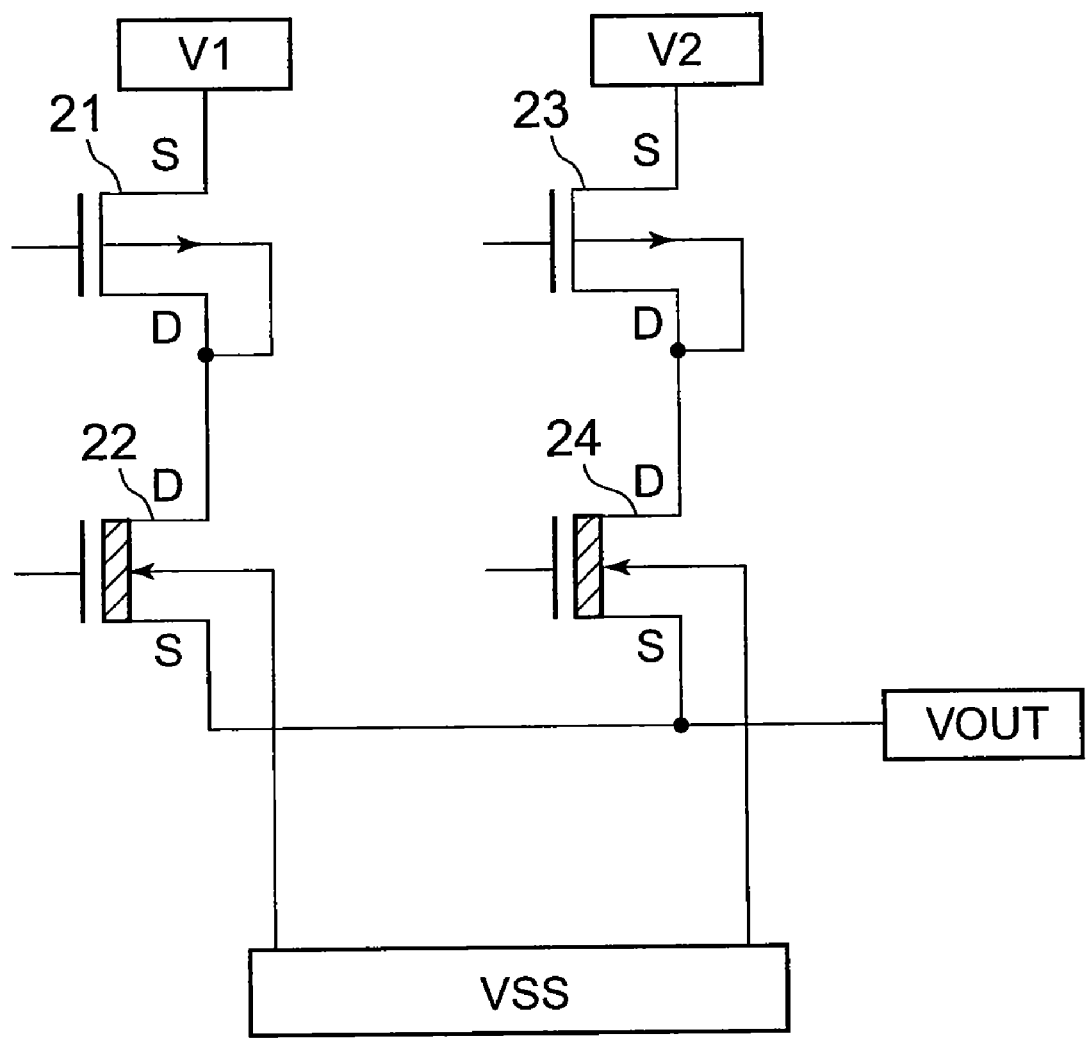
FIG. 2 is a circuit diagram illustrating a conventional power supply switching circuit.

First, a description is given of the configuration of a power supply switching circuit that switches over a power supply voltage that is output when data is read and written with respect to a memory cell of a nonvolatile memory such as an EEPROM. FIG. 1 is a circuit diagram illustrating the power supply switching circuit.

The power supply switching circuit according to the present invention is applied with a plurality of power supply voltages. More specifically, the power supply switching circuit is applied with power supply voltages VPP1 to VPP3. The power supply voltage VPP1 is the highest voltage among the plurality of power supply voltages, the power supply voltage VPP2 is lower than the power supply voltage VPP1, and the power supply voltage VPP3 is lower than the power supply voltage VPP2. For example, the voltage values of the power supply voltages VPP1 to VPP3 are 17 V, 12 V, and 5 V, respectively. The power supply switching circuit is applied with a ground voltage VSS. The power supply switching circuit receives input voltages VIN1 to VIN3, and outputs a power supply voltage VOUT. For example, a voltage value of each of the input voltages VIN1 to VIN3 is 5 V.

The power supply switching circuit according to the present invention includes LS circuits (level shifter circuits) 11 to 13, an enhancement type PMOS transistor 14, and depletion type NMOS transistors 15 and 16.

The LS circuit 11 has an input terminal input with the input voltage VIN1, and an output terminal connected to a gate of the enhancement type PMOS transistor 14, and is supplied with the power supply voltage VPP1 and the ground voltage VSS. The LS circuit 12 has an input terminal input with the input voltage VIN2, and an output terminal connected to a gate of the depletion type NMOS transistor 15, and is supplied with the power supply voltage VPP1 and the ground voltage VSS. The LS circuit 13 has an input terminal input with the input voltage VIN3, and an output terminal connected to a gate of the depletion type NMOS transistor 16, and is supplied with the power supply voltage VPP1 and the ground voltage VSS. The enhancement type PMOS transistor 14 has a gate input with a voltage based on the input voltage VIN1, a source and a back gate input with the power supply voltage VPP1, and a drain disposed on the output terminal side to output the power supply voltage VOUT. The depletion type NMOS transistor 15 has a gate input with a voltage based on the input voltage VIN2, a source disposed on the output terminal side to output the power supply voltage VOUT, a drain input with the power supply voltage VPP2, and a back gate input with the ground voltage VSS. The depletion type NMOS transistor 16 has a gate input with a voltage based on the input voltage VIN3, a source disposed on the output terminal side to output the power supply voltage VOUT, a drain input with the power supply voltage VPP3, and a back gate input with the ground voltage VSS.

Next, a description is given of the operation of the power supply switching circuit according to the present invention.

[Case Where Power Supply Voltage VOUT is Switched to Power Supply Voltage VPP1]

The input voltages VIN1 to VIN3 become a low signal, and are then input to the enhancement type PMOS transistor 14, the depletion type NMOS transistor 15, and the depletion type NMOS transistor 16 through the LS circuits 11 to 13, respectively. In this case, the low signal is the ground voltage VSS. Then, the enhancement type PMOS transistor 14 is turned off, and the depletion type NMOS transistors 15 and 16 are turned off. Hence, the power supply voltage VPP1 is output as the power supply voltage VOUT.

With the above-mentioned configuration, the depletion type NMOS transistors 15 and 16 are an NMOS transistor, and hence, even if the source voltages of the depletion type NMOS transistors 15 and 16 become the power supply voltage VPP1, the depletion type NMOS transistors 15 and 16 do not operate in a bipolar manner.

Further, the enhancement type PMOS transistor 14 is a PMOS transistor, and hence, a voltage between the gate and the source of the enhancement type PMOS transistor 14 is ensured even if the gate voltage of the enhancement type PMOS transistor 14 reaches the ground voltage VSS, the enhancement type PMOS transistor 14 is turned on, and the source voltage and the drain voltage of the enhancement type PMOS transistor 14 are substantially equal to each other. Hence, almost no voltage drop occurs between the source and the drain of the enhancement type PMOS transistor 14, and the power supply voltage VPP1 is output as the power supply voltage VOUT with almost no voltage drop in the power supply voltage VPP1. Hence, the power consumption is reduced.

The gate voltages of the depletion type NMOS transistors 15 and 16 are the ground voltage VSS, and the source or the drain of each of the depletion type NMOS transistors 15 and 16 is any one of the power supply voltages VPP1 to VPP3. Therefore, a voltage between the gate and the source of each of the depletion type NMOS transistors 15 and 16 becomes such a minus voltage that the depletion type NMOS transistors 15 and 16 are completely turned off, and hence the depletion type NMOS transistors 15 and 16 are completely turned off. Hence, no leak current flows in the depletion type NMOS transistors 15 and 16 at all.

[Case Where Power Supply Voltage VOUT is Switched to Power Supply Voltage VPP2]

The input voltages VIN1 to VIN3 become a high signal, a high signal, and a low signal, respectively, and are then input to the enhancement type PMOS transistor 14, the depletion type NMOS transistor 15, and the depletion type NMOS transistor 16 through the LS circuits 11 to 13, respectively. In this case, the low signal is the ground voltage VSS, and the input voltages VIN1 and VIN2 that are high signals are shifted in level to the power supply voltage VPP1. Then, the enhancement type PMOS transistor 14 is turned off, the depletion type NMOS transistor 15 is turned on, and the depletion type NMOS transistor 16 is turned off. Hence, the power supply voltage VPP2 is output as the power supply voltage VOUT.

With the above-mentioned configuration, the depletion type NMOS transistor 16 is an NMOS transistor, and hence, even if the source voltage of the depletion type NMOS transistor 16 becomes the power supply voltage VPP2, the depletion type NMOS transistor 16 does not operate in the bipolar manner. Moreover, even if the gate voltage and the source voltage of the enhancement type PMOS transistor 14 become the power supply voltage VPP1, and the drain voltage thereof becomes the power supply voltage VPP2, the enhancement type PMOS transistor 14 does not operate in the bipolar manner since the gate voltage and the source voltage of the enhancement type PMOS transistor 14 are higher than the drain voltage thereof.

Further, the gate voltage of the depletion type NMOS transistor 15 is not the power supply voltage VPP2 but the power supply voltage VPP1, and hence, even if the depletion type NMOS transistor 15 is turned on, and the source voltage and the drain voltage of the depletion type NMOS transistor 15 are substantially equal to each other, a voltage between the gate and the source of the depletion type NMOS transistor 15 is ensured. Hence, almost no voltage drop occurs between the source and the drain of the depletion type NMOS transistor 15, and the power supply voltage VPP2 is output as the power supply voltage VOUT with almost no voltage drop in the power supply voltage VPP2. Hence, the power consumption is reduced.

Further, the gate voltage of the enhancement type PMOS transistor 14 is the power supply voltage VPP1, and hence the enhancement type PMOS transistor 14 is turned off, whereby no leak current flows in the enhancement type PMOS transistor 14. The gate voltage of the depletion type NMOS transistor 16 is the ground voltage VSS, and the source or the drain of the depletion type NMOS transistor 16 is any one of the power supply voltages VPP2 and VPP3. Therefore, a voltage between the gate and the source of the depletion type NMOS transistor 16 becomes such a minus voltage that the depletion type NMOS transistor 16 is completely turned off, and hence the depletion type NMOS transistor 16 is completely turned off. Hence, no leak current flows in the depletion type NMOS transistor 16 at all.

Further, only one transistor exists between the power supply voltages VPP1 to VPP3 and the power supply voltage VOUT, respectively, and hence the number of elements is small.

Further, the transistor does not operate in the bipolar manner, and hence the size of the enhancement type PMOS transistor 14 is reduced. In addition, a space between the PMOS transistor and the NMOS transistor is reduced. Moreover, the number of guard rings for stabilizing a well voltage of the enhancement type PMOS transistor 14 is reduced. Hence, the used area is decreased.

The input voltages VIN1 to VIN3 are shifted in level to the power supply voltage VPP1 by the LS circuits 11 to 13, respectively. However, the input voltages VIN1 to VIN3 may be each shifted in level to such a voltage that the source voltage and the drain voltage of each of the enhancement type PMOS transistor 14 and the depletion type NMOS transistors 15 and 16 are substantially equal to each other when the respective transistors are turned on. More specifically, the input voltage VIN2 that has shifted in level needs only to be equal to or higher than a voltage obtained by adding a threshold voltage of the depletion type NMOS transistor 15 to the power supply voltage VPP2, and the input voltage VIN3 that has shifted in level needs only to be equal to or higher than a voltage obtained by adding a threshold voltage of the depletion type NMOS transistor 16 to the power supply voltage VPP3.

When the input voltage VIN2 is changed to the input voltage VIN3, the LS circuit 12 is changed to the LS circuit 13, the power supply voltage VPP2 is changed to the power supply voltage VPP3, and the depletion type NMOS transistor 15 is changed to the depletion type NMOS transistor 16, a description of a case where the power supply voltage VOUT is switched to the power supply voltage VPP2 corresponds a description of a case where the power supply voltage VOUT is switched to the power supply voltage VPP3.

Further, three power supply voltages are used, but two, or four or more power supply voltages may be used. In this case, a power supply voltage being the highest voltage among a plurality of power supply voltages is supplied to the source of the enhancement type PMOS transistor, and other power supply voltages are supplied to the drain of the depletion type NMOS transistor.

What is claimed is:

1. A power supply switching circuit that switches over a plurality of power supply voltages used within a nonvolatile memory to output the plurality of switched power supply voltages to a power supply voltage output terminal, comprising:
   a first power supply voltage input terminal to which a first power supply voltage being a highest voltage among the plurality of power supply voltages is input;
   a second power supply voltage input terminal to which a second power supply voltage being a voltage lower than the first power supply voltage is input;
   an enhancement type PMOS transistor that is disposed between the first power supply voltage input terminal and the power supply voltage output terminal, and has a back gate connected to the first power supply voltage;
   a depletion type NMOS transistor that is disposed between the second power supply voltage input terminal and the power supply voltage output terminal, and has a back gate connected to a ground voltage VSS;
   a first level shift circuit that converts an amplitude of a first control signal for controlling a gate of the enhancement type PMOS transistor from the first power supply voltage into the ground voltage VSS; and
   a second level shift circuit that converts an amplitude of a second control signal for controlling a gate of the depletion type NMOS transistor from the first power supply voltage into the ground voltage VSS.

2. A power supply switching circuit that switches over a plurality of power supply voltages used within a nonvolatile memory to output the plurality of switched power supply voltages to a power supply voltage output terminal, comprising:
   a first power supply voltage input terminal to which a first power supply voltage being a highest voltage among the plurality of power supply voltages is input;
   a second power supply voltage input terminal to which a second power supply voltage being a voltage lower than the first power supply voltage is input;
   an enhancement type PMOS transistor that is disposed between the first power supply voltage input terminal and the power supply voltage output terminal, and has a back gate connected to the first power supply voltage;
   a depletion type NMOS transistor that is disposed between the second power supply voltage input terminal and the power supply voltage output terminal, and has a back gate connected to a ground voltage VSS;
   a first level shift circuit that converts an amplitude of a first control signal for controlling a gate of the enhancement type PMOS transistor from the first power supply voltage into the ground voltage VSS; and
   a second level shift circuit that converts an amplitude of a second control signal for controlling a gate of the depletion type NMOS transistor from the second power supply voltage into the ground voltage VSS.

3. A power supply switching circuit according to claim 1, wherein the nonvolatile memory comprises an EEPROM.

4. A power supply switching circuit according to claim 2, wherein the nonvolatile memory comprises an EEPROM.

* * * * *